US009093226B2

(12) United States Patent
Gardner et al.

(10) Patent No.: US 9,093,226 B2
(45) Date of Patent: Jul. 28, 2015

(54) ENERGY STORAGE DEVICE, METHOD OF MANUFACTURING SAME, AND MOBILE ELECTRONIC DEVICE CONTAINING SAME

(71) Applicant: Intel Corporation, Santa Clara, CA (US)

(72) Inventors: Donald S. Gardner, Los Altos, CA (US); Wei Jin, Sunnyvale, CA (US); Zhaohui Chen, San Jose, CA (US); Charles W. Holzwarth, San Jose, CA (US); Cary L. Pint, Hayward, CA (US); Bum Ki Moon, Santa Clara, CA (US); John L. Gustafson, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 13/621,354

(22) Filed: Sep. 17, 2012

(65) Prior Publication Data

US 2014/0078644 A1    Mar. 20, 2014

(51) Int. Cl.
| | |
|---|---|
| *H01G 9/00* | (2006.01) |
| *H01G 11/26* | (2013.01) |
| *H01G 11/04* | (2013.01) |
| *H01G 11/30* | (2013.01) |
| *H01G 11/86* | (2013.01) |
| *H01L 49/02* | (2006.01) |

(52) U.S. Cl.
CPC ............. *H01G 11/26* (2013.01); *H01G 9/0029* (2013.01); *H01G 11/04* (2013.01); *H01G 11/30* (2013.01); *H01G 11/86* (2013.01); *H01L 28/82* (2013.01); *Y02E 60/13* (2013.01); *Y10T 29/417* (2015.01)

(58) Field of Classification Search
CPC ............................ H01G 11/26; H01G 11/30
USPC ......................................................... 361/502
See application file for complete search history.

(56) References Cited

U.S. PATENT DOCUMENTS

| | | | |
|---|---|---|---|
| 5,635,419 | A | 6/1997 | Geiss et al. |
| 6,833,983 | B2 | 12/2004 | Nguyen et al. |
| 7,050,291 | B2 | 5/2006 | Narendra et al. |
| 7,324,328 | B2 | 1/2008 | Narendra et al. |

(Continued)

FOREIGN PATENT DOCUMENTS

| | | |
|---|---|---|
| JP | 10-321481 A | 12/1998 |
| JP | 2011-243863 A | 12/2011 |

(Continued)

OTHER PUBLICATIONS

Alper et al., "Silicon carbide coated silicon nanowires as robust electrode material for aqueous micro-supercapacitor", Apr. 17, 2012, Applied Physics Letters 100, 163901-1-163901-4.*

(Continued)

*Primary Examiner* — Eric Thomas
(74) *Attorney, Agent, or Firm* — Kenneth A. Nelson

(57) ABSTRACT

An energy storage device includes a first electrode (110, 510) including a first plurality of channels (111, 512) that contain a first electrolyte (150, 514) and a second electrode (120, 520) including a second plurality of channels (121, 522) that contain a second electrolyte (524). The first electrode has a first surface (115, 511) and the second electrode has a second surface (125, 521). At least one of the first and second electrodes is a porous silicon electrode, and at least one of the first and second surfaces comprises a passivating layer (535).

2 Claims, 6 Drawing Sheets

(56) References Cited

U.S. PATENT DOCUMENTS

| | | | |
|---|---|---|---|
| 7,393,604 | B2 | 7/2008 | Rocke et al. |
| 7,404,887 | B2 | 7/2008 | Katsir et al. |
| 7,541,782 | B2 | 6/2009 | Narendra et al. |
| 2002/0048153 | A1* | 4/2002 | Seshan .......................... 361/704 |
| 2003/0086238 | A1 | 5/2003 | Bendale et al. |
| 2003/0165741 | A1 | 9/2003 | Maly-Schreiber et al. |
| 2004/0070921 | A1 | 4/2004 | Ikeda et al. |
| 2004/0090735 | A1 | 5/2004 | Kimura et al. |
| 2005/0262675 | A1 | 12/2005 | Sun |
| 2007/0002525 | A1 | 1/2007 | Yamanoi et al. |
| 2007/0177332 | A1 | 8/2007 | Kobayashi et al. |
| 2010/0176767 | A1 | 7/2010 | Long et al. |
| 2010/0200403 | A1 | 8/2010 | Lopatin et al. |
| 2010/0221606 | A1 | 9/2010 | Nalamasu et al. |
| 2011/0053018 | A1 | 3/2011 | Morse et al. |
| 2011/0075324 | A1 | 3/2011 | Singh |
| 2011/0149476 | A1 | 6/2011 | Saida et al. |

FOREIGN PATENT DOCUMENTS

| | | |
|---|---|---|
| WO | 2005/022568 A1 | 3/2005 |
| WO | 2011/123135 A1 | 10/2011 |
| WO | 2013/048465 A1 | 4/2013 |
| WO | 2014/042750 A1 | 3/2014 |

OTHER PUBLICATIONS

Fondacaro, "Novel Energy Storage Device: porous silicon ultracapacitor with superior performance", Feb. 28, 2011, Nontechnology Now.*

Salonen et al. "Studies of Thermally-Carbonized Porous Silicon Surfaces", Physica Status Solidi (a), Nov. 28, 2000, vol. 182, Issue 1, pp. 123-126.

Salonen et al. "Chemical Stability Studies of Thermally-Carbonized Porous Silicon", MRS Proceedings, 2001, vol. 638, 6 pages.

Salonen et al. "Thermal Carbonization of Porous Silicon Surface by acetylene", Journal of Applied Physics, Jan. 1, 2002, vol. 91, No. 1, pp. 456-461.

Boukherroub et al. "Thermal Hydrosilylation of Undecylenic Acid with Porous Silicon", Journal of the Electrochemical Society, Jan. 7, 2002, vol. 149, Issue 2, pp. 59-63.

Salonen et al. "Thermal Analysis of Hydrosilylation of 1-Dodecene on Porous Silicon Surface", Physica Status Solidi (a), May 2003, vol. 197, Issue 1, pp. 246-250.

Zhang et al. "Nondegrading Photoluminescence in Porous Silicon", The American Physical Society, Aug. 24, 1998, vol. 81, No. 8, pp. 1710-1713.

Boukherroub et al. "Thermal Route for Chemical Modification and Photoluminescence Stabilization of Porous Silicon", Physica Status Solidi (a), Nov. 28, 2000, vol. 182, Issue 1, pp. 117-121.

Boukherroub et al. "Ideal Passivation of Luminescent Porous Silicon by Thermal, Noncatalytic Reaction with Alkenes and Aldehydes", Published by American Chemical Society, May 4, 2001, pp. 2002-2011.

Zeng et al. "Preparation of Co-Passivated Porous Silicon by Stain Etching", Materials Chemistry and Physics, 2005, vol. 90, Issues 2-3, pp. 310-314.

Korotcencov et al. "Silicon Porosification: State of the Art" Critical Reviews in Solid State and Materials Sciences, 2010, pp. 153-260.

Ruminski et al. "Porous Silicon-Based Optical Microsensors for Volatile Organic Analytes: Effect of Surface Chemistry on Stability and Specificity" Advanced Functional Materials, Sep. 9, 2010, vol. 20, Issue 17, pp. 2874-2883.

Desplobain et al., "Investigations on Porous Silicon as Electrode Material in Electrochemical Capacitors", Physica status solidi, vol. 4, Issue 6, May 2007, pp. 2180-2184.

International Search Report and Written Opinion received for PCT Patent Application No. PCT/US2011/054372, mailed on May 2, 2012, 10 pages.

International Search Report and Written Opinion received for PCT Patent Application No. PCT/US2011/059211, mailed on Jul. 9, 2012, 10 pages.

International Search Report and Written Opinion received for PCT Patent Application No. PCT/US2011/064013, mailed on Aug. 28, 2012, 9 pages.

International Search Report and Written Opinion received for PCT Patent Application No. PCT/US2011/067434, mailed on Sep. 10, 2012, 10 pages.

Makila et al. "Amine-Modification of Thermally Carbonized Porous Silicon with Silane Coupling Chemistry", from ACS Publications, Langmuir, Retrieved on Sep. 18, 2012, 47 pages.

U.S. Appl. No. 13/584,488, filed Aug. 13, 2012, 31 pages.

PCT Patent Application No. PCT/US2011/066650, filed on Dec. 21, 2011, 34 pages.

PCT Patent Application No. PCT/US2011/064969, filed on Dec. 14, 2011, 35 pages.

PCT Patent Application No. PCT/US2012/031719, filed on Mar. 30, 2012, 38 pages.

PCT Patent Application No. PCT/US2011/068046, filed on Dec. 30, 2011, 18 pages.

PCT Patent Application No. PCT/US2011/067485, filed on Dec. 28, 2011, 21 pages.

PCT Patent Application No. PCT/US2012/025973, filed on Feb. 21, 2012, 29 pages.

PCT Patent Application No. PCT/US2012/034972, filed on Apr. 25, 2012, 32 pages.

International Search Report and Written Opinion received for PCT Patent Application No. PCT/US2013/048681, mailed on Oct. 17, 2013, 9 pages.

International Preliminary Report on Patentability received for PCT Patent Application No. PCT/US2013/048681, mailed on Mar. 26, 2015, 6 pages.

European Search Report received for European Patent Application No. 13837601.7 mailed on Apr. 1, 2015, 05 pages of Search Report.

Office Action Received for Korean Patent Application No. 2014-7008233 mailed on Mar. 26, 2015, 5 pages of Office Action and 2 pages of English Translation.

\* cited by examiner

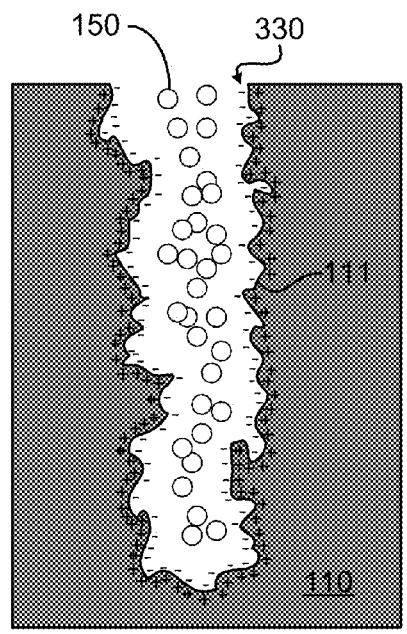
FIG. 3
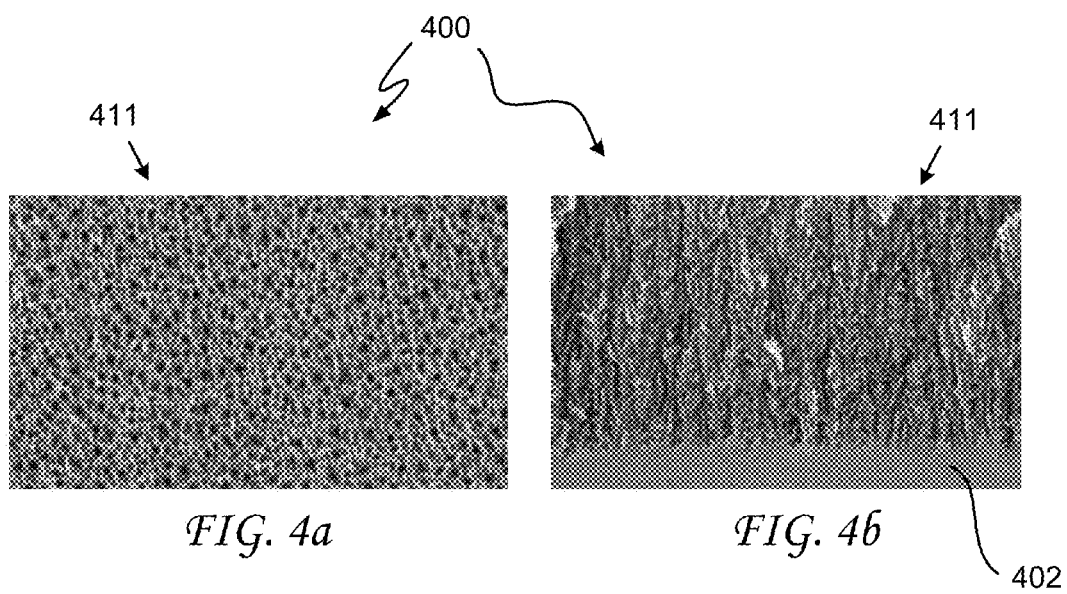
FIG. 4a
FIG. 4b

ENERGY STORAGE DEVICE, METHOD OF MANUFACTURING SAME, AND MOBILE ELECTRONIC DEVICE CONTAINING SAME

FIELD OF THE INVENTION

The disclosed embodiments of the invention relate generally to energy storage, and relate more particularly to electrochemical capacitive energy storage devices.

BACKGROUND OF THE INVENTION

Modern societies depend on the ready availability of energy. As the demand for energy increases, devices capable of efficiently storing energy become increasingly important. As a result, energy storage devices, including batteries, capacitors, electrochemical capacitors (ECs), (including pseudocapacitors and electric double-layer capacitors (EDLCs) (sometimes called ultracapacitors, among other names)), hybrid ECs, and the like are being extensively used in the electronics realm and beyond. In particular, capacitors are widely used for applications ranging from electrical circuitry and power delivery to voltage regulation and battery replacement. Electrochemical capacitors are characterized by high energy storage capacity, rapid charge/discharge ability, and large cycle lifetimes, as well as other desirable characteristics including high power density, small size, and low weight, and have thus become promising candidates for use in several energy storage applications.

BRIEF DESCRIPTION OF THE DRAWINGS

The disclosed embodiments will be better understood from a reading of the following detailed description, taken in conjunction with the accompanying figures in the drawings in which:

FIG. 3 is a depiction of an electric double layer formed within a channel of a porous structure according to an embodiment of the invention;

FIGS. 4a and 4b are images of, respectively, a surface and a cross-sectional slice of a porous silicon structure;

Figure 1:
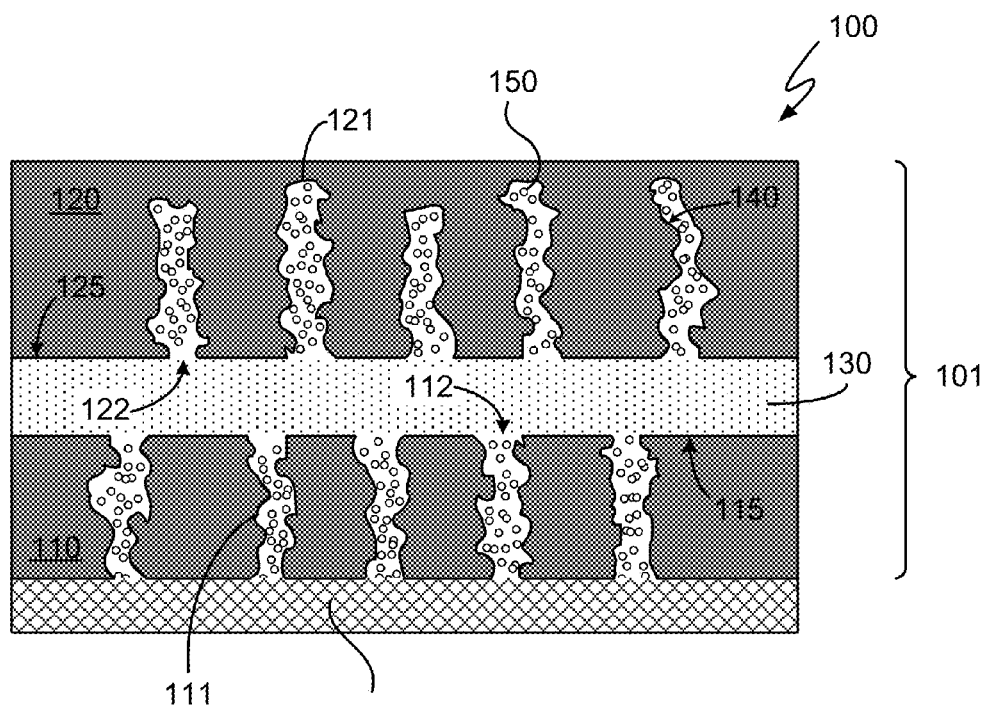
FIGS. 1 and 2 are cross-sectional views of an energy storage structure according to embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an energy storage device comprises a first electrode comprising a first plurality of channels that contain a first electrolyte and a second electrode comprising a second plurality of channels that contain a second electrolyte. The first electrode has a first surface and the second electrode has a second surface. At least one of the first and second electrodes is a porous silicon electrode, and at least one of the first and second surfaces comprises a passivating layer.

Although much of the discussion herein will focus on electrochemical capacitors, the "energy storage device" designation explicitly includes—in addition to ECs—hybrid electrochemical capacitors (which, like electrochemical capacitors, are discussed in more detail below) as well as batteries, fuel cells, and similar devices that store energy. Energy storage devices according to embodiments of the invention can be used for a wide variety of applications, including in personal computers (PCs), including desktop and laptop (notebook) computers, tablet computers, cell phones, smart phones, music players, servers, other electronic devices, automobiles, buses, trains, airplanes, other transportation vehicles, home energy storage, storage for energy generated by solar or wind energy generators—especially energy harvesting devices—and many others.

Electrochemical capacitors operate according to principles similar to those that govern conventional parallel plate capacitors, but certain important differences do apply. One significant difference concerns the charge separation mechanism. For one important class of ECs this typically takes the form of a so-called electric double layer, or EDL, rather than the dielectric of a conventional capacitor. The EDL is created at an interface between an electrolyte and a high-surface area electrode by the electrochemical behavior of electrons (or electronic holes) on one side of the interface and ionic charge carriers on the other side, and results in an effective separation of charge in spite of the fact that the two layers within the double layer are so close together. (Physical separation distances are on the order of a single nanometer.) Thus, a typical EDL capacitor may be thought of as storing charge in its EDL. Each layer of the EDL, which is formed when a voltage is applied across the interface, is electrically conductive—conduction is performed by ions in the electrolyte and by electrons/holes in the electrode—but the properties of the double layer prevent current from flowing across the boundary between them. (The EDL is further discussed below in connection with FIG. 3.)

As is true in conventional capacitors, capacitance in an EDL capacitor is proportional to the surface area of the electrodes and inversely proportional to the charge separation distance. The very high capacitances achievable in an EDL capacitor are due in part to the very high surface area attributable to the multi-channel porous structure and to the nanometer-scale charge separation distance attributable to the EDL, which arises due to the presence of an electrolyte, as explained above. One type of electrolyte that may be used in accordance with embodiments of the invention is an ionic liquid. Another is an electrolyte comprising an ion-containing solvent. Organic electrolytes, aqueous electrolytes, and solid-state electrolytes are also possible.

Another class of electrochemical capacitor is the pseudocapacitor, where, in addition to EDL capacitance, an additional storage mechanism—one that is Faradaic and not electrostatic in origin—can arise at the surface of certain types of electrodes. The additional storage mechanism is typically referred to as "pseudocapacitance," and is characterized by a charge storage process that is similar to the operation of many solid-electrode batteries. The two storage mechanisms complement each other, leading to even greater energy storage potential than is possible with EDL capacitance alone. Typically, one of the electrodes of a pseudocapacitor is coated with a transition metal oxide, a suitable conducting polymer, or a similar material that makes up the active material where charge is stored. These materials can be used with an electrolyte such as a potassium hydroxide (KOH) solution; when the device is charged, the electrolyte will react with the material and drive a charge transfer reaction where energy is stored. More specifically, these materials store most of their energy through highly-reversible surface and near-surface electron transfer (e.g., redox (Faradaic)) reactions, which enable higher power than bulk storage in conventional batteries due to the fast charge and discharge kinetics.

It will be understood that pseudocapacitors may be constructed using electrolytes other than the one mentioned above. For example, ion-containing solvents such as $Li_2SO_4$ or $LiPF_6$ may be used as the electrolyte; these result in an intercalation reaction that involves the insertion of a species into the surface of the host structure without breaking any bonds. This reaction, like the other pseudocapacitive reactions mentioned earlier, results in a transfer of charge so it too is Faradaic and considered a redox reaction, albeit a special type of redox reaction.

Hybrid electrochemical capacitors are energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Figure 2:
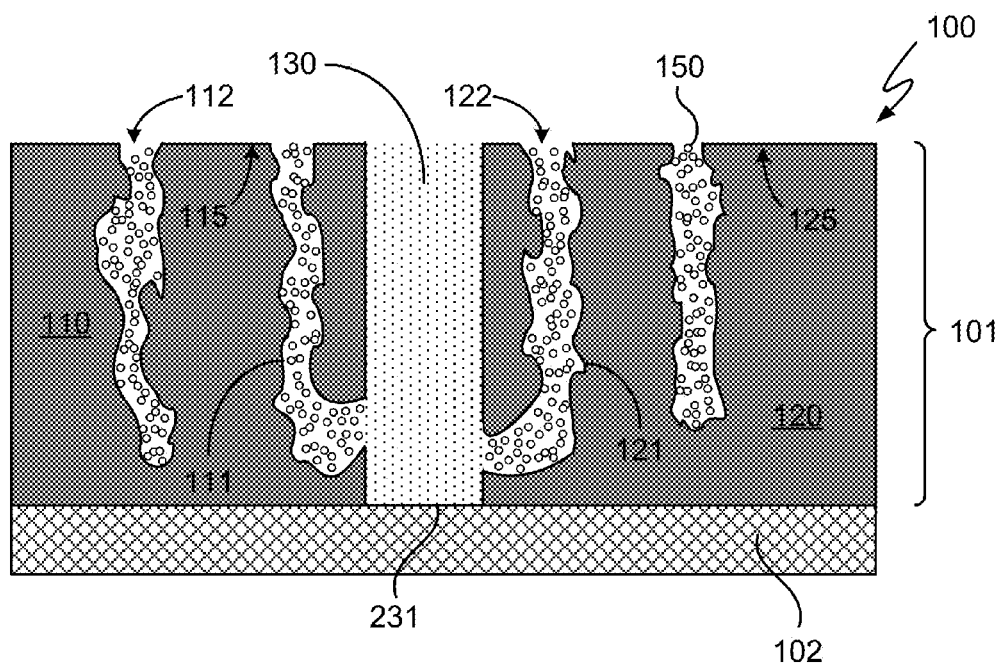

Referring now to the drawings, FIGS. 1 and 2 are cross-sectional views of an energy storage structure 100 that will be used to guide an initial discussion introducing concepts and structures that will aid in the understanding of embodiments of the present invention. As illustrated in FIG. 1, energy storage structure 100 comprises an energy storage device 101 and an electrically conductive support structure 102. (In some embodiments support structure 102 can be omitted.) Alternatively, as illustrated in FIG. 2, energy storage structure 100 comprises energy storage device 101 and a non-conductive support structure 102.

Energy storage device 101 comprises an electrically conductive structure 110 and an electrically conductive structure 120 separated from each other by a separator 130 that is an electron insulator and an ionic conductor. Separator 130 prevents electrically conductive structures 110 and 120 from physically contacting each other, thereby preventing an electrical short circuit. (In other embodiments, for reasons discussed below, a separator is not necessary and can be omitted.)

In some embodiments, at least one of electrically conductive structures 110 and 120 comprises a porous structure containing multiple channels, each one of which has an opening to a surface of the porous structure. This feature is a result of an exemplary process, described below, used to form the porous structure in certain embodiments. As an example, the porous structure may be formed within an electrically conductive or a semiconductive material. Alternatively, the porous structure may be formed within an insulating material (e.g., alumina) that has been coated with an electrically conductive film (e.g., an atomic layer deposition (ALD) conductive film such as titanium nitride (TiN), tungsten, or ruthenium). In this regard, materials having greater electrical conductivity are advantageous because they lower the energy storage device's effective series resistance (ESR). In the illustrated embodiments, both electrically conductive structure 110 and electrically conductive structure 120 comprise such a porous structure. Accordingly, electrically conductive structure 110 comprises channels 111 with openings 112 to a surface 115 of the corresponding porous structure and electrically conductive structure 120 comprises channels 121 with openings 122 to a surface 125 of the corresponding porous structure.

Various configurations of energy storage device 101 are possible. In the embodiment of FIG. 1, for example, energy storage device 101 comprises two distinct porous structures (that is, electrically conductive structure 110 and electrically conductive structure 120) that have been bonded together face-to-face with separator 130 in between. As another example, in the embodiment of FIG. 2 energy storage device 101 comprises a single planar porous structure in which a first section (electrically conductive structure 110) is separated from a second section (electrically conductive structure 120)

by a trench 231 containing separator 130. One of the electrically conductive structures will be the positive side of the device and the other electrically conductive structure will be the negative side. Trench 231 may separate electrically conductive structure 110 and 120 along a straight line, but alternatively may separate them using a more complex shape such as the meandering space between the fingers of two interdigitated electrodes.

As an example, separator 130 could be a permeable membrane or other porous polymer separator. In general, the separator prevents the physical contact of anode and cathode (which could cause an electrical malfunction in the device) while permitting the transfer of ionic charge carriers. In addition to polymer separators, several other separator types are possible. These include non-woven fiber sheets or other non-woven separators, liquid membranes, polymer electrolytes, solid ion conductors, glass fiber, paper, ceramic, and the like. In some embodiments, non-woven separators are concentrations of fibers that are either randomly oriented or are arranged in a directional pattern.

It should be noted that the separator, although shown in FIG. 2, may not be necessary in the configuration illustrated there because, for example, support structure 102 could be used to maintain a physical separation between structures 110 and 120. As another example, electrically conductive structures 110 and 120 could each be attached to a ceramic package (not shown) that would keep the two electrically conductive structures physically separate from each other.

As an example, the porous structure of electrically conductive structures 110 and 120 can be created by a wet etch process in which a liquid etchant applied to a surface of the electrically conductive structures etches away portions of the electrically conductive structure in a way that is at least somewhat similar to the way water is able to carve channels in rock. This is why each one of the channels formed in this way has an opening to the surface of the electrically conductive structure: the wet etch method is incapable of creating fully-enclosed cavities, i.e., cavities within the porous structure that have no opening to the surface (like an air bubble trapped inside a rock). This is not to say that those openings cannot be covered with other materials or otherwise closed up because of the presence of or addition of other materials—that is in fact likely to occur in several embodiments—but, whether covered or not, the described openings to the surface are a feature of each channel in each porous structure according to at least one embodiment of the invention. (One embodiment in which the openings may be covered up is one in which a layer of epitaxial silicon as a location for circuitry or other wiring is grown on top of the channels).

With the right etchant, it should be possible to make porous structures having the described characteristics from a wide variety of materials. Silicon in various forms—including metallurgical grade silicon, monocrystalline silicon, polycrystalline silicon, and silicon on insulator—is one material that works well. As an example, a porous silicon structure may be created by etching a silicon substrate with a mixture of hydrofluoric acid (HF) and alcohol (ethanol, methanol, isopropyl, etc.). More generally, porous silicon and other porous structures may be formed by such processes as anodization and stain etching. Etching techniques according to embodiments of the invention will be discussed in more detail below. Some other materials (besides silicon) that may be especially well-suited for energy storage devices according to embodiments of the invention are porous germanium and porous tin.

Possible advantages of using porous silicon include its compatibility with existing silicon technology and its abundance in the earth's crust. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge, which is an undesirable result.) Porous germanium is also highly compatible with silicon technology. Possible advantages of using porous tin, which is a zero-band-gap material, include its enhanced conductivity with respect to certain other conductive and semiconductive materials.

Other materials may also be used for the porous structure, including semiconducting materials such as gallium arsenide (GaAs), indium phosphide (InP), boron nitride (BN), silicon carbide (SiC), and alloys such as an alloy of silicon and germanium. Organic semiconductors may also be used. In some embodiments the semiconducting materials—or even insulating materials—may be treated to make them electrically conductive (or more highly conductive). An example is silicon that is degenerately doped with boron. In addition to porous semiconducting substrates, porous conducting substrates may also be used for ECs, including, in certain embodiments, substrates composed of carbon or of metals such as copper, aluminum, nickel, calcium, tungsten, molybdenum, and manganese.

The etching used to make the porous structures may be accomplished using an electrochemical etch that makes use of a dilute mixture of HF and alcohol to form nanometer pores that can extend through a significant portion of the substrate. As an example, a porous structure such as porous semiconducting structure 110 or 120 may be prepared by applying an electrochemical etch technique to a solid silicon wafer having an initial resistivity of 0.7 milli-ohm centimeters (mΩ-cm) using as the etchant one of the HF mixtures referred to above. A current density in a range of approximately 25 milliamps per square centimeter ($mA/cm^2$) to 500 $mA/cm^2$ may be used. (The area component in these values refers to an area of the substrate surface before formation of the pores.)

The foregoing discussion has made reference to porous structures according to embodiments of the invention. These porous structures, as mentioned, can be formed within a variety of materials, including silicon (in various forms, including metallurgical grade silicon, monocrystalline silicon, polycrystalline silicon, and silicon on insulator), germanium, GaAs, InP, BN, CdTe, tin, copper, aluminum, nickel, calcium, tungsten, molybdenum, manganese, silicon carbide, organic semiconductors, and silicon-germanium alloys. The material from which the porous structure is made can, in at least some embodiments, be doped with elements that increase its conductivity; this may be done using standard techniques that are known in the art. In one embodiment, the material in which the porous structure is formed is silicon and the dopant species is boron, which may be introduced into the silicon in a concentration of, for example, $10^{19}$ atoms/$cm^3$. Other possible dopants include phosphorus and arsenic (though these and other n-type dopants require an illumination process during etching that p-type dopants do not).

Embodiments of the invention that rely on electrochemical etching as the channel creation technique have another reason for introducing dopants into the material from which the porous structure is to be made. Where silicon and an HF etchant are involved, it is thought that a high electric field attracts holes at defects and at the tip of the pores that aid the reaction between the silicon and the fluorine from the etchant. It is thought that the process involves the formation of $SiF_4$ molecules in liquid form. The $SiF_4$ gets pulled away and eventually gets washed out of the channels, leaving hydrogen atoms that bond to the sidewalls and also form $H_2$ that then bubbles away as a gas. Some hydrogen atoms remain; these bond with remaining silicon atoms. This process etches the channel (anisotropically) downward as opposed to expanding laterally in an isotropic manner (which would simply polish the surface without forming channels). Additional details, as best understood, are set forth below (though it must be said that precise details of the mechanism of porous silicon formation remain at least somewhat unclear).

In general terms, during channel formation, direct dissolution of the semiconductor almost always competes with oxidation plus subsequent dissolution of the oxide. The etchant (e.g., HF), therefore, has to be able to dissolve the oxide. A second prerequisite for the dissolution reaction and thereby channel formation in a semiconductor is the availability of electronic holes. The silicon surface, in contact with aqueous HF solutions, becomes saturated by hydrogen, depleted of electronic holes, and tends to be chemically inactive with respect to the electrolyte (this protects the channel sidewalls during the etching process). If a voltage is applied to the electrodes, the holes present in a silicon wafer start migrating towards the silicon-electrolyte interface. At the interface, a hole removes one silicon bond and thereby makes one silicon atom more susceptible for interactions with the electrolyte. Eventually, the silicon atom is transferred into the solution. The electrode decomposes into areas with optimal current density and channels are formed in areas with almost no current density. According to different models, initiation of the channel growth could begin at micro-cavities, structural defects, mechanically strained areas, or local perturbations of the surface potential field.

Referring again to FIGS. 1 and 2, energy storage structure 100 further comprises (in the embodiment illustrated in FIG. 1) an electrically conductive coating 140 on at least a portion of the porous structure and in at least some of channels 111 and/or channels 121. Such an electrically conductive coating may be necessary in order to maintain or enhance the conductivity of the porous structure, which can also lower the ESR, thereby improving performance. For example, a device having lower ESR is able to deliver higher power (which may be manifested in terms of greater acceleration, more horse power, etc.). In contrast, higher ESR (a condition that often prevails inside a typical battery) limits the amount of available energy, at least partially due to the fact that much of the energy is wasted as heat, which is a key consideration for both long-term performance and safety.

Illustrated in FIGS. 1 and 2 is an electrolyte 150, which gives rise to the EDL, as explained above. Electrolyte 150 (as well as the other electrolytes described herein) is represented in the drawings using a random arrangement of circles. This representation is intended to convey the idea that the electrolyte is a substance (liquid or solid, including gel-like materials) containing free ionic charge carriers. The circles were chosen for convenience and are not intended to imply any limitation as to the electrolyte components or qualities, including any limitation with respect to the size, shape, or number of the ionic charge carriers.

After the introduction of electrolyte 150, an electric double layer is formed within the channels of the porous structure, as depicted schematically in FIG. 3. In that figure, an electric double layer 330 has been formed within one of channels 111. EDL 330 is made up of two components: the electrical charge of the sidewalls of channel 111 (depicted as being positive in FIG. 3 but which in other embodiments could be negative); and the free ionic charge carriers in the electrolyte. EDL 330 thus provides a separation of charge that is necessary in order for the capacitor to function. As explained earlier, the large capacitance, and, hence, energy storage potential, of EDL capacitors arises in part due to the small (approximately 1 nanometer (nm)) separation distance between electrolyte ionic charge carriers and the electrode surface charge.

It should be noted that the FIG. 1 and FIG. 2 depictions of the porous structures are highly idealized in that, to mention just one example, all of channels 111 and 121 are shown as only extending vertically. In reality the channels may branch off in multiple directions to create a tangled, disordered pattern that may look something like the porous structure shown in FIGS. 4a and 4b.

FIGS. 4a and 4b are scanning electron microscope (SEM) images of, respectively, a surface and a cross-sectional slice of a porous structure 400 (in this case porous silicon). As illustrated, porous structure 400 contains multiple channels 411. It should be understood that channels 411 are likely to twist and turn along their lengths such that a single channel may have both vertical and horizontal portions as well as portions that are neither completely vertical nor completely horizontal but fall somewhere in between. Note that in FIG. 4b, the channels extend near to but do not quite reach a bottom of the etched structure, thus leaving a layer 402 of un-etched silicon underneath the channels. In one embodiment, un-etched layer 402 acts as a support structure for porous structure 400 (and for the corresponding energy storage device, not shown), and is thus the equivalent of support structure 102. In some embodiments, as mentioned above, the support structure may be omitted.

The etching process, described earlier, used to form porous silicon results in a surface that is initially covered by silicon-hydrogen containing species. Desorption of this hydrogen over time results in a contraction in the lattice spacing and thus in mechanical stress that can lead to cracking of the porous region. A correlation between hydrogen desorption and strain has been experimentally found during thermal annealing between 300 and 400° Celsius (° C.). In addition, aging of the porous silicon surface in atmosphere, especially when accompanied by thermal treatment, transforms it into silicon dioxide. Among other reasons, this is undesirable because silicon dioxide: is an electrical insulator; creates a series capacitance that reduces total capacitance; and creates an instability with the electrolyte because it grows over time.

The problems arising from hydrogen desorption may be mitigated by limiting the depth of the pores to about 10 micrometers ("microns" or "µm"), but this approach limits the total energy stored in the porous silicon-based EC, and it adds cost to the process. Embodiments of the invention address the hydrogen desorption issue by electrochemically treating the surface in order to remove the hydrogen and passivate the surface with a passivating layer (e.g., a conductive film), thus protecting the surface, improving (lowering) the ESR, and enabling the formation of a robust and stable device.

Figure 5:
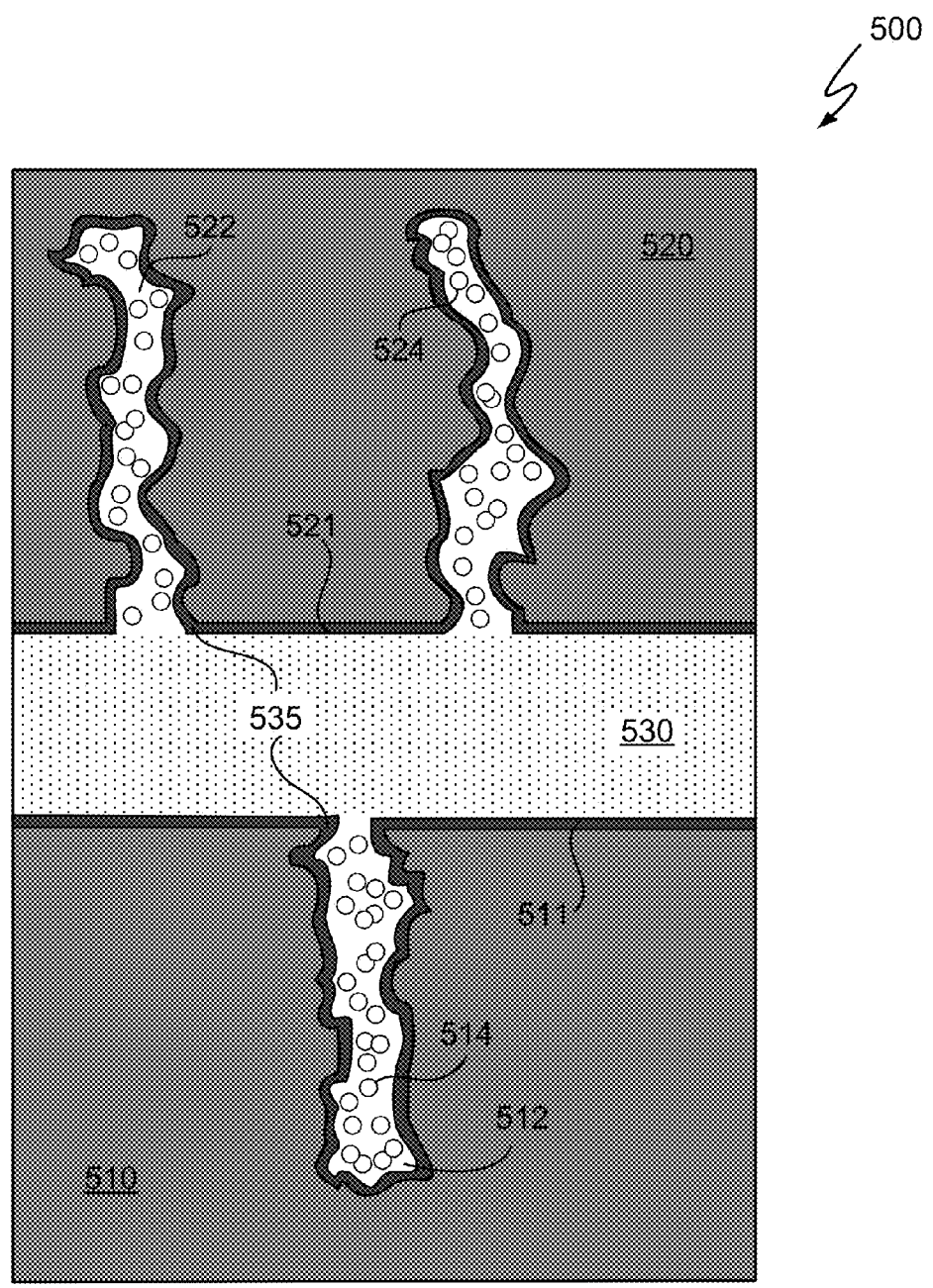
FIG. 5 is a cross-sectional view of a portion of an energy storage device according to an embodiment of the invention.

FIG. 5 is a cross-sectional view of a portion of an energy storage device 500 according to an embodiment of the invention. Energy storage device 500 is similar to, and shares many characteristics with, energy storage structure 100 of FIGS. 1 and 2, but is shown at a larger scale in order to more clearly show certain structural details that will be discussed below.

As illustrated in FIG. 5, energy storage device 500 includes an electrode 510 (equivalent to electrically conductive structure 110 of energy storage structure 100) and an electrode 520 (equivalent to electrically conductive structure 120 of energy storage structure 100) separated by a separator 530 (equivalent to separator 130 of energy storage structure 100). At least one of electrodes 510 and 520 is made of porous silicon. Electrode 510 has a surface 511 and comprises a plurality of channels 512 (only one of which is shown) that contain an electrolyte 514, and porous semiconducting structure 520 has a surface 521 and comprises a plurality of channels 522 that contain an electrolyte 524. In the illustrated embodiment, surfaces 511 and 521 each comprise a passivating layer 535. In other (non-illustrated) embodiments, perhaps only one of those surfaces comprises a passivating layer; this allows for (or takes into account) the possibility that: (1) the two electrodes may be made of different materials; and (2) the two electrodes may be passivated differently (e.g., using different materials and/or techniques) with one or the other perhaps not being passivated at all.

In one embodiment, passivating layer 535 comprises a plurality of Si—C bonds. These Si—C bonds can include regular covalent bonds between Si (silicon) atoms and C (carbon) atoms as well as ionic bonds and other interactions like van der Waals forces. The word "bond" (or "bonds") as used herein includes all of these interactions as well as any others that are capable of holding the relevant particles or compounds in place. Such bonds—and other parameters such as the percentage of the passivating layer that they represent—may be detected using analysis techniques such as Fourier transform infrared spectroscopy (FTIR). As an example, passivating layer 535 may be formed by processes such as carbonization, hydrocarbonization, hydrosilylation, and the like as further described below.

It should be mentioned that a passivating layer made up of Si—C bonds would be very stable—so stable that it may be difficult to deposit other materials onto it. A Si—C passivation layer may thus have to be functionalized—perhaps using the same kind of processing discussed elsewhere herein—in order to restore some degree of reactivity. (Functionalization, it should be mentioned, is a form of surface modification that introduces functional groups onto a surface for the purpose of controlling chemical reactions of molecules on the surface.) It may seem counterintuitive to reduce reactivity in a first series of processing steps only to restore some (at least) of that reactivity later. The seeming contradiction may be understood, however, by realizing that: (1) an overall goal of all the processing is to increase the usability of the passivated device; and (2) unlike the initial reactivity arising out of the presence of the silicon-hydrogen containing species (which, as explained above, results in undesirable, and often uncontrollable, reactions), the reactivity restored by functionalization is stable, controlled, and can be optimized such that it occurs only with select materials or compounds.

Figure 6:
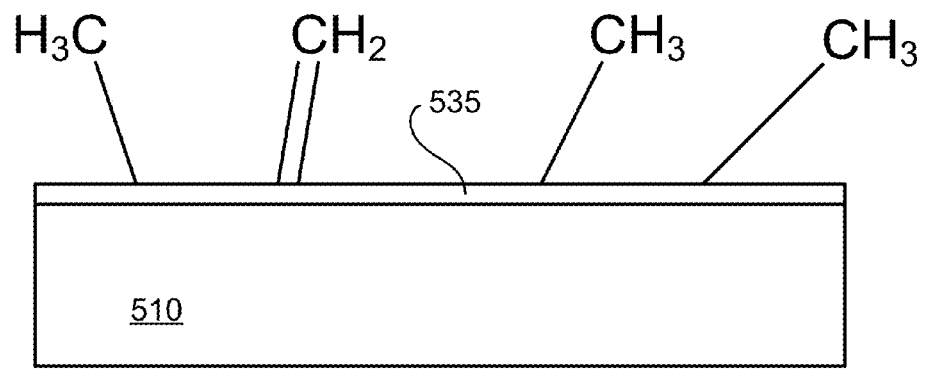
FIG. 6 is a schematic representation of an electrode having a hydrocarbon-terminated surface according to an embodiment of the invention.

In one embodiment, passivating layer 535 comprises a hydrocarbon-terminated surface. This is represented schematically in FIG. 6.

There is a chance that passivating the porous silicon surface, as, for example, by introducing passivating layer 535, can result in an inert surface, or in a surface that is less reactive than desired. (A reactive surface may be desirable due to its ability to accept or to bond with subsequently-deposited materials that are put into place for their potentially advantageous properties.) Accordingly, a porous silicon surface that has been provided with a passivating layer according to embodiments of the invention (e.g., by carbonization, hydrocarbonization, hydrosilylation) may, according to further embodiments, be functionalized (or re-functionalized) using techniques such as the thermal addition of undecylenic acid or undecylenic aldehyde. It should be noted here that carbonization, hydrocarbonization, and hydrosilylation may themselves also be considered functionalizing techniques (in addition to being passivating techniques) in the sense that none of these processes results in a totally inert surface. (Carbonization comes the closest to doing so, but even after carbonization surface reactions are still possible.) Rather, each technique significantly reduces the number of silicon-hydrogen bonds and silicon dangling bonds present on the surface (passivation) and in the process converts the surface in such a way that it will react differently than it did originally in the presence of the initial silicon-hydrogen containing species (functionalization).

In various embodiments, the passivating layer can be electrically conductive or can act as an intercalation barrier (or both). In the same or other embodiments, it can comprise a plurality of bonds between silicon and a metal. Examples of metals that can be used in this context include iron, cobalt, and nickel. In embodiments making use of those exemplary metals, Si—H bonds can be exchanged for Si—Fe, Si—Co, or Si—Ni using etching techniques with solutions such as hydrofluoric acid with ferric nitrate (or other aqueous solutions containing metallic ions) either during or following porous silicon formation. The porous silicon surface then becomes passivated with metal ions.

Furthermore, in various embodiments the passivating layer can provide protection against chemical reactions with the electrolyte, or it could promote adhesion with a subsequent layer—perhaps a solid-state electrolyte or the like. All of the results mentioned above (e.g., adhesion promotion, protection against chemical reactions, electrical conduction, intercalation barrier, passivation) help to enable an electrode that is capable of operating at higher voltages than would be possible otherwise. Higher operating voltages, of course, lead to increased energy storage potential according to the relationship $E=\frac{1}{2}CV^2$ (where E represents energy, C capacitance, and V voltage). Part of the reason for the higher achievable operating voltages is that the Si—C bonds that are present in the passivating layer are very stable—much more stable than Si—H. (The same is also true of Si—Fe, Si—Co, and Si—Ni, which were mentioned above.) Indeed, the instability of Si—H is a major motivation for the passivating layer.

Although the passivating layer can be electrically conductive, as mentioned above, an additional electrically conductive layer could be used in conjunction with the passivating layer in order to make an even better device. As an example, the additional electrically conductive layer could be TiC or TiN—perhaps formed using ALD—or could be a ternary compound comprising, for example, Ti, C, and N. As another example, a pseudocapacitive material—such as vanadium nitride, vanadium oxide, niobium oxide, a transition metal oxide, a transition metal nitride, or the like—could be placed on top of the passivating layer.

Figure 7:
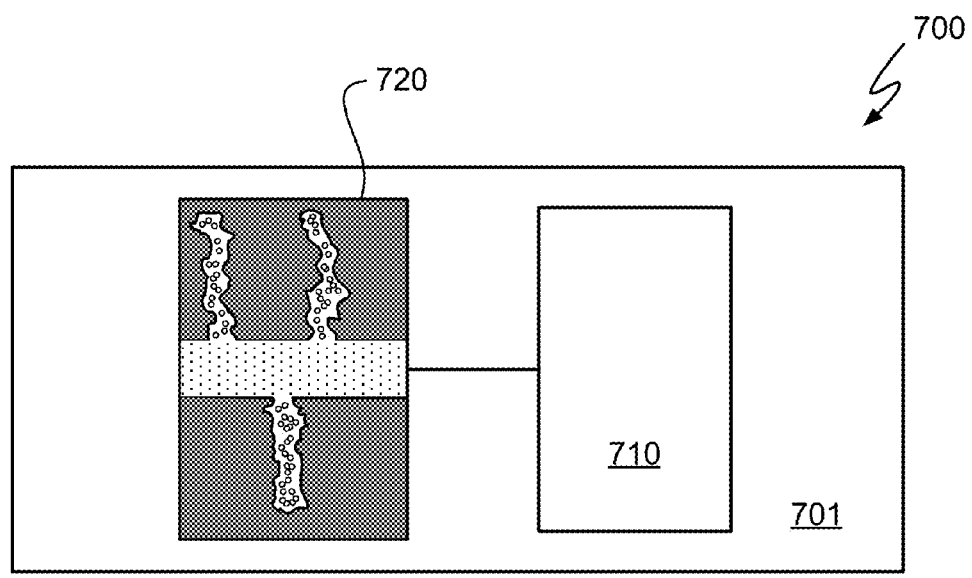
FIG. 7 is a schematic illustration of a mobile electronic device containing an energy storage device according to an embodiment of the invention.

In one embodiment, an energy storage device like those described above can be used as part of a mobile electronic device such as a cell phone, a smart phone, a music player (or another hand-held computing system), a laptop, a nettop, a tablet (or another mobile computing system), or the like. FIG. 7 is a schematic representation of a mobile electronic device 700 according to an embodiment of the invention. As illustrated in FIG. 7, mobile electronic device 700 comprises a housing 701, an integrated circuit (IC) die 710 within the housing, and an energy storage device 720 within housing 701 and associated with IC die 710 so as to be capable of providing energy to the IC die. In some embodiments, being "associated with" IC die 710 means energy storage device 720 is integrated into IC die 710 or its packaging in some fashion (e.g., by being implemented on the die itself; by forming part of a Package-on-Package (PoP) architecture or a system-on-chip (SoC) architecture; etc.) As an example, energy storage device 720 can be similar to energy storage device 500, described above and shown in FIG. 5. It should be understood, however, that the depictions in the figures of energy storage devices 500 and 720 are potentially incomplete in that they omit certain details that would likely, or at least possibly, be present in a finished device. These potentially include one or more collectors attached to particular electrodes as well as various packaging components.

IC die 710 may comprise any type of integrated circuit device. In one embodiment, IC die 710 includes a processing system (either single core or multi-core). For example, the IC die may comprise a microprocessor, a graphics processor, a signal processor, a network processor, a chipset, etc. In one embodiment, the IC die comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices.

As mentioned above, carbonization is one technique that may be used in order to produce a passivating layer on a porous silicon electrode. There exist various carbonization methods and recipes; the following detailed recipe (for forming a non-stoichiometric Si—C surface on porous silicon) should be understood as illustrative rather than limiting.

First, hydrogen-terminated porous silicon samples are flushed under a nitrogen flow at room temperature for more than 30 minutes. This removes oxygen and moisture. Next, acetylene ($C_2H_2$) is added to the gas flow in a 1:1 ratio with the nitrogen. The initial acetylene introduction occurs at room temperature and the samples are then heated over a period of 15 minutes to 500° C. using a furnace or a rapid thermal process (RTP) system. The acetylene flow is then cut off, and the furnace or RTP system is allowed to cool back to room temperature under the nitrogen flow. The material resulting from the performance of these steps may be called thermally hydrocarbonized porous silicon, or THCPSi). Once the samples have returned to room temperature the acetylene flow is resumed at the same 1:1 ratio with the nitrogen, and then after 10 minutes is once again cut off (though the nitrogen flow is maintained). The samples are then brought within ten minutes to 820° C. Finally, the samples are allowed to cool back down to room temperature under the nitrogen flow, with the end result being thermally carbonized porous silicon (TCPSi).

Figure 8:
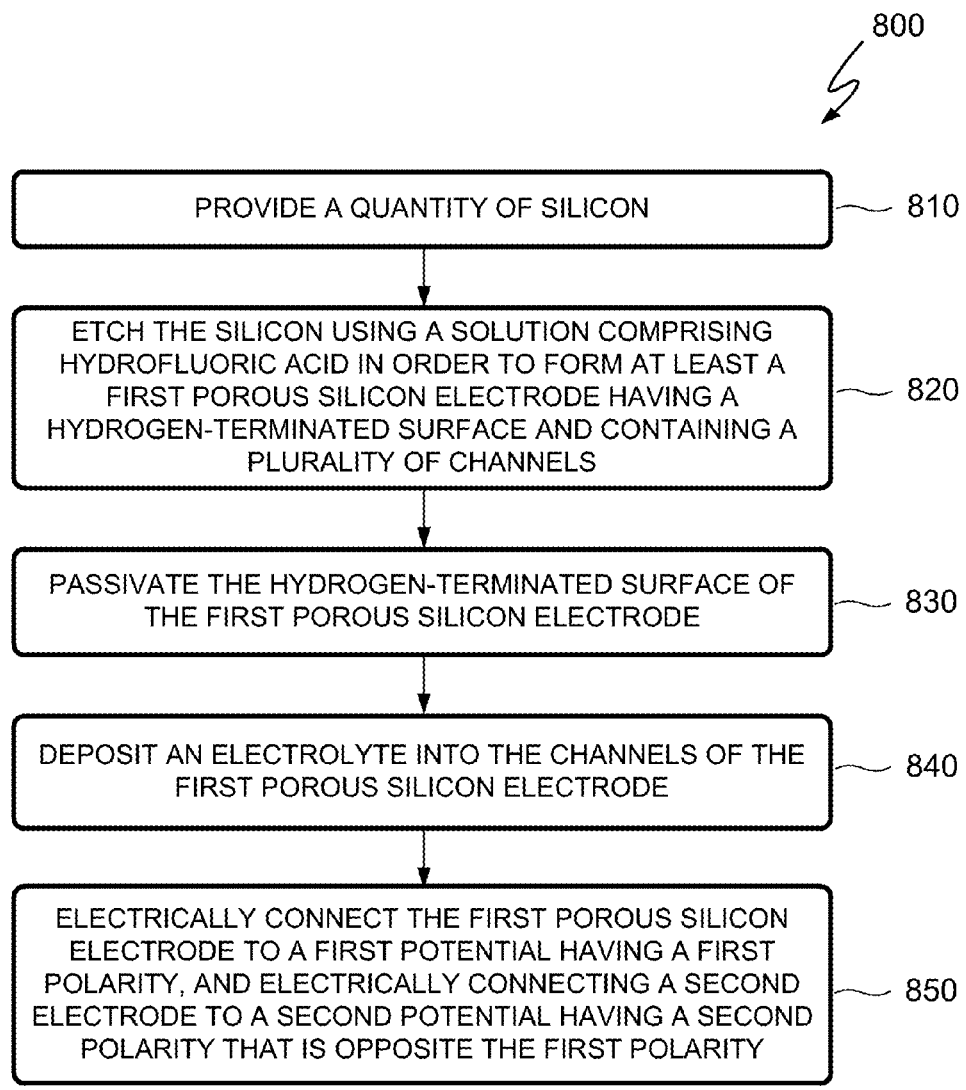
FIG. 8 is a flowchart illustrating a method of manufacturing an energy storage device according to an embodiment of the invention.

FIG. 8 is a flowchart illustrating a method 800 of manufacturing an energy storage device according to an embodiment of the invention. As an example, the performance of method 800 can result in an energy storage device that is similar to energy storage device 500 and/or energy storage device 720 that were described elsewhere herein.

A step 810 of method 800 is to provide a quantity of silicon.

A step 820 of method 800 is to etch the silicon using a solution comprising hydrofluoric acid and alcohol in order to form at least a first porous silicon electrode having a hydrogen-terminated surface and containing a plurality of channels. As an example, the first porous silicon electrode and the plurality of channels can be similar to, respectively, electrode 510 and channels 512 that were first shown in FIG. 5.

A step 830 of method 800 is to passivate the hydrogen-terminated surface of the first porous silicon electrode. In one embodiment, step 830 comprises carbonizing the hydrogen-terminated surface. In one embodiment, carbonizing the hydrogen-terminated surface comprises causing an absorption of acetylene into the hydrogen-terminated surface of the first porous silicon electrode by exposing the hydrogen-terminated surface to acetylene in a furnace at a temperature greater than 400° C. In other embodiments, other gases (e.g., ethane, methane, propane, butane, pentane, etc.) could be used in place of or in addition to acetylene.

In a particular embodiment, step 830 (or another step) further comprises exposing the hydrogen-terminated surface to a 1:1 ratio of nitrogen and acetylene at 500° C. It should be noted that the surface chemistry is very sensitive to temperature, to the point where it is affected even by position within the furnace.

In another embodiment, carbonizing the hydrogen-terminated surface comprises causing an absorption of acetylene into the hydrogen-terminated surface of the first porous silicon electrode by: exposing the hydrogen-terminated surface to a flow of acetylene at an ambient temperature equal to a first temperature; increasing the ambient temperature to a second temperature that is at least 800° C.; stopping the flow of acetylene before the second temperature is reached; and annealing the first porous silicon electrode at the second temperature.

In one embodiment, the anneal is performed in a nitrogen atmosphere (e.g., in order to avoid the formation of an oxide crust, which would be undesirable because it would not be electrically conductive). In the same or another embodiment, the anneal may be performed for a length of time sufficient to allow a first monolayer and a second monolayer of the first porous silicon electrode to each be at least 50 percent converted to porous silicon carbide. It's possible that the entire electrode will be converted to SiC but it is more likely that just the first two monolayers will be so converted.

In still another embodiment, step 830 comprises replacing at least some of the hydrogen atoms with atoms of a metal. Examples of suitable metals include iron, cobalt, and nickel. In still a further embodiment, step 830 is performed using hydrosilylation.

As is known in the art, hydrosilylation is similar to carbonization but is performed in solution rather than in a furnace. A hydrogen-terminated porous silicon surface can be provided with a passivating layer by causing it to react with unsaturated compounds (alkenes and alkynes, for example) in order to form a stable monolayer. Some of the compounds that have been shown to work well for hydrosilylation of silicon are 1-pentene, 1-dodecene, cis-2-pentene, 1-pentyne, 1-dodecyne, and 2-hexyne. The process results in the replacement of Si—$H_x$ bonds with Si—C bonds, which passivates the porous silicon surface.

A step 840 of method 800 is to deposit an electrolyte into the channels of the first porous silicon electrode. As an example, the electrolyte can be similar to electrolyte 514 that was shown in FIG. 5.

A step 850 of method 800 is to electrically connect the first porous silicon electrode to a first potential having a first polarity, and electrically connecting a second electrode to a second potential having a second polarity that is opposite the first polarity. As an example, the second electrode can be similar to electrode 520 that was shown in FIG. 5.

Figure 9:
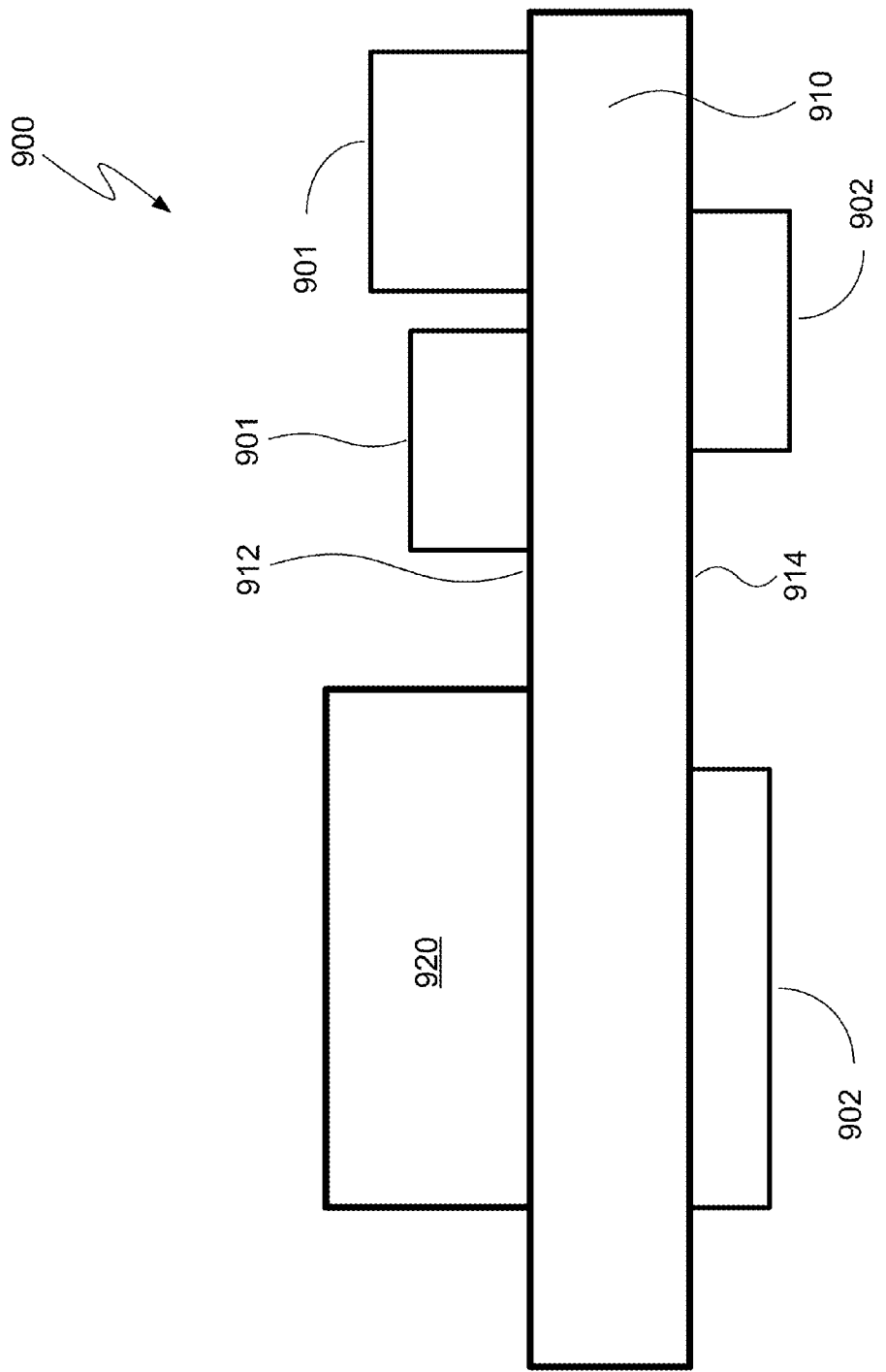
FIG. 9 is a schematic representation of a computing system according to an embodiment of the invention.

Turning now to FIG. 9, illustrated is an embodiment of a computing system 900. System 900 includes a number of components disposed on a mainboard or other circuit board 910. Board 910 includes a first side 912 and an opposing second side 914, and various components may be disposed on either one or both of the first and second sides. In the illustrated embodiment, computing system 900 includes an energy storage device 920 disposed on side 912, and energy storage device 920 may comprise any of the embodiments described herein. As an example, energy storage device 920 can be similar to energy storage device 500 that is shown in FIG. 5.

System 900 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Board 910 may comprise any suitable type of circuit board or other substrate capable of providing electrical communication between one or more of the various components disposed on the board. In one embodiment, for example, board 910 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with board 910. However, it should be understood that the disclosed embodiments are not limited to the above-described PCB and, further, that board 910 may comprise any other suitable substrate.

In addition to energy storage device 920, one or more additional components may be disposed on either one or both sides 912, 914 of the board 910. By way of example, as shown in the figures, components 901 may be disposed on side 912 of board 910, and components 902 may be disposed on the board's opposing side 914. Additional components that may be disposed on board 910 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, computing system 900 includes a radiation shield. In a further embodiment, computing system 900 includes a cooling solution. In yet another embodiment, computing system 900 includes an antenna. In yet a further embodiment, computing system 900 may be disposed within a housing or case. Where the board is disposed within a housing, some of the components of computing system 900—e.g., a user interface device, such as a display or keypad, and/or a power supply, such as a battery—may be electrically coupled with board 910 (and/or a component disposed on this board) but may be mechanically coupled with the housing.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage device and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An energy storage device comprising:
a first electrode comprising a first plurality of channels that contain a first electrolyte, the first electrode having a first surface; and
a second electrode comprising a second plurality of channels that contain a second electrolyte, the second electrode having a second surface,
wherein:
at least one of the first and second electrodes is a porous silicon electrode; and
at least one of the first and second surfaces comprises a passivating layer, wherein the passivating layer comprises a hydrocarbon-terminated surface.

2. A mobile electronic device comprising:
a housing;
an integrated circuit die within the housing; and
an energy storage device within the housing and associated with the integrated circuit die so as to be capable of providing energy to the integrated circuit die, wherein the energy storage device comprises:
a first electrode comprising a first plurality of channels that contain a first electrolyte, the first electrode having a first surface; and
a second electrode comprising a second plurality of channels that contain a second electrolyte, the second electrode having a second surface,
wherein:
at least one of the first and second electrodes is a porous silicon electrode; and
at least one of the first and second surfaces comprises a passivating layer, wherein the passivating layer comprises a hydrocarbon-terminated surface.

* * * * *